United States Patent [19]

Araps et al.

[11] Patent Number: 4,699,803

[45] Date of Patent: * Oct. 13, 1987

[54] METHOD FOR FORMING ELECTRICAL COMPONENTS COMPRISING CURED VINYL AND/OR ACETYLENE TERMINATED COPOLYMERS

[75] Inventors: Constance J. Araps, Wappingers Falls; Steven M. Kandetzke, Fishkill; Mark A. Takacs, Poughkeepsie, all of N.Y.

[73] Assignee: International Business Machines Corporation, Armonk, N.Y.

[ * ] Notice: The portion of the term of this patent subsequent to Mar. 31, 2004 has been disclaimed.

[21] Appl. No.: 684,518

[22] Filed: Dec. 21, 1984

Related U.S. Application Data

[63] Continuation-in-part of Ser. No. 556,734, Nov. 30, 1983, abandoned.

[51] Int. Cl.$^4$ ............................................. B05D 5/12
[52] U.S. Cl. ..................................... 437/243; 427/96; 427/337; 427/385.5
[58] Field of Search ................ 427/82, 96, 54.1, 35, 427/337, 385.5, 331, 348, 377; 430/319; 29/576 W; 148/DIG. 168

[56] References Cited

U.S. PATENT DOCUMENTS

| | | | |
|---|---|---|---|
| 3,682,698 | 8/1972 | Palmer et al. | 427/377 X |
| 3,985,597 | 10/1976 | Zielinski | 427/91 X |
| 4,030,948 | 6/1977 | Berger | 148/33.3 |
| 4,258,146 | 3/1981 | Balanson et al. | 525/106 |
| 4,333,794 | 6/1982 | Beyer et al. | 148/1.5 |
| 4,347,306 | 8/1982 | Takeda et al. | 430/312 |
| 4,353,778 | 10/1982 | Fineman et al. | 156/644 |
| 4,438,273 | 3/1984 | Landis | 528/125 |
| 4,485,231 | 11/1984 | Landis | 528/125 |
| 4,515,828 | 5/1985 | Economy et al. | 427/82 |

OTHER PUBLICATIONS

Mukai et al, "Planar Multilevel Interconnection Technology Employing a Polyimide", IEE Journal of Solid-State Circuits, vol. 13, No. 4, Aug. 1978, pp. 462–467.

*Primary Examiner*—Richard Bueker
*Attorney, Agent, or Firm*—Shirley Church Moore

[57] ABSTRACT

Electronic components are disclosed comprising an insulator which is the in situ cured reaction product of a polymerizable oligomer which is end capped with vinyl or acetylenic end groups. The polymerizable oligomer comprises polyamic acids, the corresponding polyamic esters, the corresponding polyisoimides and mixtures thereof. A process for forming the electronic components comprising the insulator is also disclosed.

32 Claims, 5 Drawing Figures

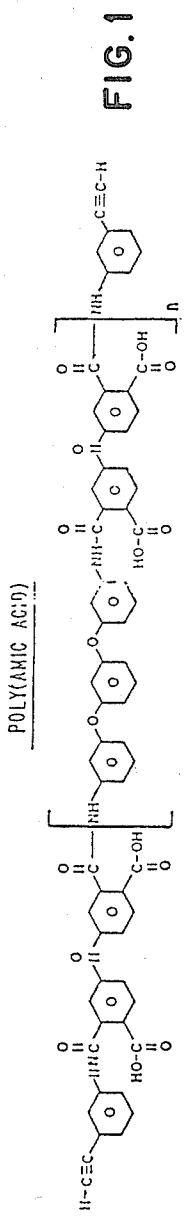
FIG. 1
POLY(AMIC ACID)
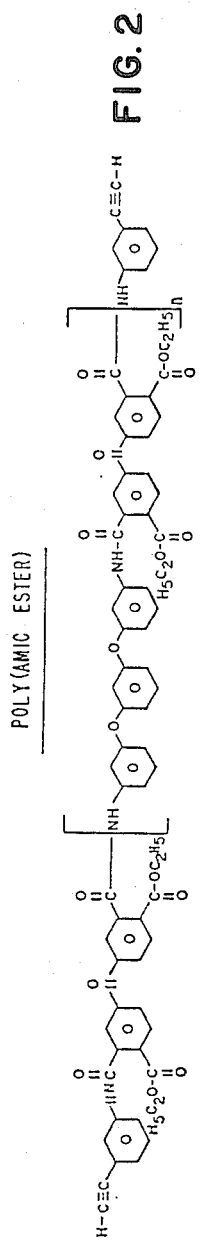
FIG. 2
POLY(AMIC ESTER)
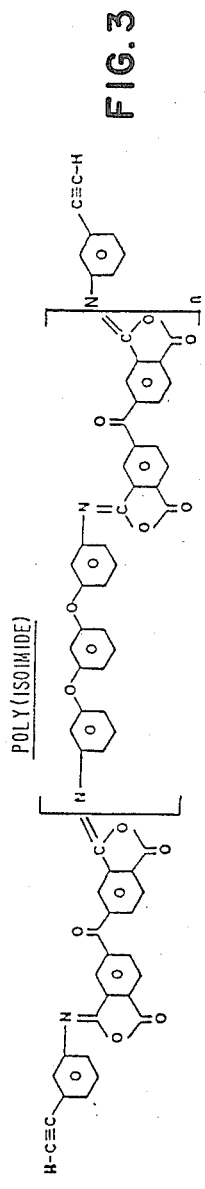
FIG. 3
POLY(ISOIMIDE)
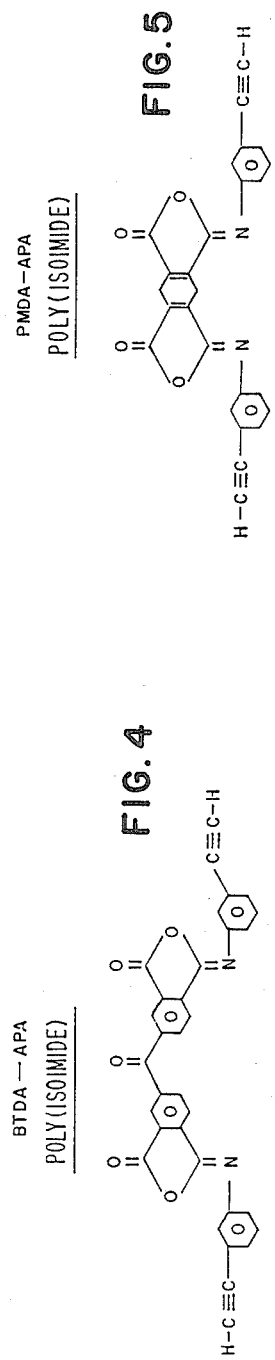
FIG. 4
BTDA—APA POLY(ISOIMIDE)
FIG. 5
PMDA—APA POLY(ISOIMIDE)

METHOD FOR FORMING ELECTRICAL COMPONENTS COMPRISING CURED VINYL AND/OR ACETYLENE TERMINATED COPOLYMERS

BACKGROUND OF THE INVENTION

RELATED APPLICATION

This application is a continuation-in-part of U.S. application Ser. No. 556,734, filed Nov. 30, 1983 now abandoned.

FIELD OF THE INVENTION

The present invention relates to electronic components comprising cured vinyl and/or acetylene terminated polymerizable oligomers and to methods of producing the same.

BACKGROUND OF THE INVENTION

There is a significant interest in the semiconductor industry in replacing traditional inorganic dielectric materials with polymeric materials as device deep dielectric isolation (often termed trenches in the art), etc. Polymeric materials are less expensive, can be more easily purified and fabricated, and potentially have better thermal and electrical characteristics than some inorganic counterparts.

In the monolithic integrated circuit technology, it is usually necessary to isolate various active and passive elements from one another in the integrated circuit structure. These devices have been isolated by back biasing, PN junctions, partial dielectric isolation and complete dielectric isolation. The dielectric materials used have been silicon dioxide, glass, polymers and the like.

The preferred isolation for such active devices and circuits is some form of dielectric isolation because it permits the circuit elements and the like to be adjacent the isolation and thereby result in greater density of packing of the active and passive devices on the integrated circuit chip.

It is also known that recessed dielectric isolation can be produced by first selectively removing silicon from a substrate so as to form trenches in the substrate and then filling the trenches with a dielectric material.

In the interest of minimizing the silicon chip area occupied by the dielectrically filled trenches, sputter etching processes and reactive ion etching processes have been utilized to form the trenches in the silicon substrate.

The following U.S. patents disclose various electronic devices involving the use of such dielectric isolation. These references are hereby incorporated by reference since the dielectric isolation of the present invention can be used in forming devices as taught in these references. U.S. Pat Nos. 3,766,438 Castrucci et al.; 3,961,355 Abbas et al.; 3,104,086 Bondur et al.; 4,138,442 Bondur et al.; 4,160,991 Anantha et al.; and 4,333,794 Beyer et al.

U.S. Pat. No. 4,030,948 Berger discloses the use of polyimide containing silicones which are deposited in a moat or groove 114 employed to control leakage across the end portions of PN junction 102. This patent is also hereby incorporated by reference since the dielectric material of the present invention can be substituted for the polyimide containing silicones of Berger.

The above-mentioned U.S. Pat. No. 4,333,794 Beyer et al. disclosed in FIG. 14 a polyimide isolation as represented by numeral 66 formed by applying a conventional polyimide material such as Monsanto Skybond and then etching back in $O_2$ plasma at room temperature. Mechanical stresses near the side wall are stated to be reduced, the polyimides are stated to have excellent planarization capability and to boost device performance since they have a lower dielectric constant than $SiO_2$.

U.S. Pat. No. 4,353,778 Fineman et al. discloses a method of etching openings in a polyimide film which can be used in an electronic device. The polyimide material is applied as polyamic acid and then partially cured and, following processing steps, the polyimide is again cured to crosslink the same so that it will resist attack by a strong base.

U.S. Pat. No. 4,347,306 Takeda et al. discloses a method for manufacturing electronic devices having a multilayer wiring structure using a polyimide dielectric material between the layers. The polyimide dielectric material is a thermosetting addition polymerization type polyimide which possesses imide rings in recurring units and a degree of polymerization which increases when cured due to the radical reaction of the present invention differ in structure, have superior properties and are cured by a different method from that disclosed in Takeda et al.

The following U.S. patents disclose polyimides, polyimide-polyamides or like materials used as insulating or passivating materials in electronic components. However, none of the materials disclosed are equivalent to those of the present invention: U.S. Pat. Nos. 3,700,497 Epifano et al.; 3,846,166 Saiki et al.; 3,486,934 Bond; 3,515,585 Chamberlin et al.; 3,985,597 Zielinski; and 4,367,119 Logan et al.

U.S. Pat. No. 4,438,273 of Landis discloses a class of polymerizable oligomers containing at least one isoimide group and terminal groups capable of undergoing an addition polymerization reaction. This patent is hereby incorporated by reference, since the polymerizable oligomers it describes are of the type which can be utilized in the present invention.

SUMMARY OF THE INVENTION

The present invention provides an electronic component comprising a three-dimensional cured product of vinyl and/or acetylene terminated polyamic acids, the corresponding polyamic esters, the corresponding polyisoimides, and mixtures thereof and a method of forming the same. Hereafter, the polymerizable materials described above are often merely referred to as a "cured polyimide" for brevity.

Major objects of the present invention are to provide dielectric and/or passivating materials for use in electronic component fabrication which are formed from oligomeric materials which have high solubility in conventional process solvents to provide a coating solution of excellent wetting and planarizing properties and which can be used, for example, to provide thin film isolation layers or to provide device deep dielectric isolation, and which can be cured free of voids, bubbles, cracks, blistering, delamination or excess shrinkage, which cured polyimide exhibits excellent adhesion, thermal stability, electrical properties and chemical resistance.

DESCRIPTION OF PREFERRED EMBODIMENTS

The major advantage of the polymerizable oligomers of the present invention and the resulting cured polyimide of the present invention is that the polymerizable oligomers can be used both to form thin film isolating layers and to fill a device deep dielectric isolation or trench in a manner similar to a monomer (providing excellent wetting, filling and planarizing capability), while the resulting totally cured polyimide exhibits properties quite dissimilar from the polymerizable oligomer, which properties are suited for the types of dielectric isolation described above.

The main criterion which the oligomers of the present invention illustrate is that they are not preimidized and they are substituted with reactive terminae, specifically with vinyl and/or acetylene groups which permit them to be thermally or catalytically cured to yield a cross-linked three dimensional dielectric material suitable for dielectric isolation, most especially deep device dielectric isolation (hereafter often merely referred to as "trench isolation" for brevity), or passivation in an electronic component.

When the present invention is utilized in the form of a thin film, cure temperatures should be minimized in order to avoid the creation of stress problems in the cured film. Accordingly, it may be necessary to catalytically cure the polymerizable oligomer. However, when the present invention is utilized in the form of a device deep dielectric (trench) isolation material, stress can be relieved by overfilling the trench, so that a simpler, less expensive thermal cure can be used. Overfilling of the trench may result in an overflow coating ranging from a few thousand Angstroms up to as much as three micrometers on various portions of the device surface. The stress in the trench is relieved via transmission through the trench and up onto the device planar surface. The overflow material can be removed in subsequent process steps.

Although the cured polyimides of the present invention find particular application as a trench filling material, they can be used in any application where dielectric isolation and/or passivation is required in an electric component, for example, as a replacement for the ceramic layers in a multilayer ceramic module, and for metal passivation upon ceramic structures. See, for example, SOLID STATE TECHNOLOGY, May 1972, Vol. 15, No. 5, pages 35–40, Kaiser et al., hereby incorporated by reference.

For purposes of this specification and the claims which follow, ceramic is defined to include a conglomeration of inorganic oxides and organic materials which may be fired during processing to burn off organic residues and sinter the inorganic oxides. Typical of the inorganic oxides are metallic oxides such as those based on silicon, aluminum, molybdenum, vanadium, etc.

Major advantages of the oligomers of the present invention are later discussed. They are polyamic acids or polyamic esters, polyisoimides and mixtures thereof which are end-capped or terminated with reactive functional groups and can be dissolved in common organic solvents to a very high solids content, e.g., as high as about 70 to 80 weight percent can be readily coated onto devices to fill trenches, and are easily planarized, that is, result in an extremely smooth, defect-free surface, and can then be thermally or optionally catalytically cured to provide a cross-linked three-dimensional network which results in a cured polyimide of high molecular weight and good thermal and chemical properties. This is opposed to conventional polyimides which cure to yield a two-dimensional network.

THE POLYMERIZABLE OLIGOMERS OF THE PRESENT INVENTION

The polymerizable oligomers of the present invention include polyamic acids, the corresponding polyamic esters, the corresponding polyisoimides and mixtures thereof. They can be represented by formulae of the type set out in FIGS. 1 through 5.

As can be seen from the formulae, the end groups of the polymerizable oligomers are end-capped with a vinyl or acetylenic end group.

Polymerizble oligomers of this type are commercially available under the trade names Thermid LR-600 (polyamic acid), Thermid AL-600 (polyamic ester) and Thermid IP-600 (polyisoimide) from the National Starch and Chemical Corp. These oligomers are shown in FIGS. 1, 2, and 3, respectively, wherein n ranges from 0 to about 50.

Similar polymerizable oligomers, of the type described in U.S. Pat. No. 4,438,273 by Landis, have been synthesized and evaluated for potential use, by the method of the present invention, in the production of electronic components. The polymerizable oligomers of Landis are, specifically, polyisoimides comprised of the class of relatively low-molecular weight oligomers which contain at least one isoimide group along with functional groups that enable the oligomers to be cured by addition polymerization. These polyisoimides include the reaction product of a carboxylic acid anhydride and a functioal amine, which reaction product has been subsequently dehydrated to form an isoimide - containing oligomer. The polymers which have been synthesized and evaluated include the polymerizable polyisoimide oligomers benzophenonetetracarboxylic-dianhydride-3-aminophenyl acetylene (BTDA-APA) and pyromellitic dianhydride-3-aminophenyl acetylene (PMDA-APA). These oligomers are shown in FIGS. 4 and 5, respectively. Note: The polyisoimides shown in 4 and 5 exhibit a molecular weight distribution indicating that some side reactions are occurring, generating structures in addition to those shown in FIGS. 4 and 5.

As initially obtained the typical molecular weight of Thermid polymerizable oligomers was on the order from about 600 to about 10,000 as determined by GPC. More recently, they have been available over a molecular weight range from about 1,000 to 25,000.

As one skilled in the art will appreciate, the molecular weights of the polymerizable oligomers of the present invention cannot be specified as a completely definite range since there is a variability in useful molecular weights depending upon the exact polymerizable oligomer selected, the solvent selected, the desire or non-desire to use multiple polymerizable oligomer applications, the desire or non-desire to have low solvent concentrations and like considerations as will be apparent to one skilled in the art. However, for most commercial process line operations, it is contemplated that useful polymerizable oligomers will have a number average molecular weight in the range of from about 1,500 to about 8,000 as determined by GPC (herein molecular weights are on the same basis unless otherwise indicated). Currently preferred polymerizable oligomers have a molecular weight of from about 2,000 to about 4,000.

The polymerizable oligomers of the present invention are soluble in common organic solvents, for example, alcohols, ketones, ethers, amides, etc., a typical exemplary solvent being N-methyl pyrrolidinone (NMP). Since they are substituted with reactive terminae they can be cured or crosslinked to yield the desired dielectric and/or passivation material in situ to provide a strong three-dimensional network which provides the desired cured polyimide of high molecular weight and good thermal and chemical properties (as opposed to conventional polyimides which cure to yield a two-dimensional network).

The polymerizable oligomers are commercially available as a dry powder which is put into solution prior to coating. Selection of a solvent for the oligomer depends on the chemical make up and structural characteristics of the oligomer. In the case of the Thermid IP-600 polyisoimide, at a solution solids of 35% by weight polyisoimide, the solution viscosity can be reduced by 20% by replacing a N-methyl pyrrolidinone (NMP) solvent with a solvent comprising a 75:25 diglyme:paraxylene mixture. However, if the polymerizable oligomers are obtained from the vendor in solution form, any additional solvent subsequently added must be compatible.

Where the oligomer is used as obtained from the vendor, the solvent content of the "as obtained" oligomer should be taken into account in determining the final amount of solvent needed for coating.

There are certain differences between the polyamic acid-ester, isoimide, imide, and analogue forms, and certain are preferred as now discussed.

As received, the Thermid-LR600 amic acid (vendor information) of formula 1 has a molecular weight range of from about 600 to about 10,000. This material also contains a small amount of a gel fraction that appears on all GPC analysis as a high molecular weight fraction, e.g., on the order of 3,000,000. To obtain excellent wetting and film forming properties, it is most preferred that this commercial material be fractionated to remove the high molecular weight components, leaving a most preferred molecular weight fraction on the order of about 2,500 to about 3,000 (GPC analysis), with only traces of the gel fraction remaining.

Fractionation is performed in a conventional manner by dissolving the product as received in N-methyl pyrrolidinone (NMP), methyl isobutyl ketone and methyl alcohol, filtering the same through a one micron filter (which removes undissolved material having a molecular weight over about 4,000), precipitating the same in toluene to remove a low molecular weight fraction, collecting the solids, dissolving the solids in acetone, filtering the same through a one micron filter, reprecipating into toluene, collecting the resulting solid and drying, whereafter the resulting product having a molecular weight of about 2,500 to about 3,000 is dissolved in NMP and passed through a one micron filter to prepare the desired coating solution.

Fractionation should also reduce the ionic content of the polyamic acid and remove unreacted monomers which might contaminate the resin and reduce its thermal stability.

The fractionated product can be dissolved in a variety of ketonic solvents, NMP, etc., and exhibits improved wetting and film forming properties as compared to the as received material, providing defect-free smooth films.

Other polymerizable oligomers as received from the vendor have a weight average molecular weight range from about 600 to 1,000 to about 10,000, as earlier indicated.

The Thermid IP-600 polyisoimide as received is precyclized from the polyamic acid of FIG. 1. The PMDA-APA and BTDA-APA polyisoimides of FIGS. 4 and 5 are synthesized by reacting the appropriate dianhydride with 3-aminophenyl acetylene to produce the corresponding polyamic acid. The polyamic acid is subsequently chemically dehydrated to produce the polyisoimide. Typical dehydration reagents are acetic anhydride, trifluoroacetic anhydride and dicyclohexylcarbo diimide.

From a process point of view, trifluoroaceticanhydride is preferred because the reaction byproducts are volatile and easily removed. From a cost point of view dicyclohexylcarbodiimide is preferred.

The polyisoimide is kinetically preferred, but the polyimide is thermo-dynamically preferred, as it is more stable, so that the finally cured polyimide can be obtained upon heating of the isoimide.

The polymerizable oligomers can be fully cured by heating at 0.5 hours at 200° C., 0.5 hours at 300° C. and 4 hours at 400° C., with all curing above 85° C. being done under nitrogen. Total weight loss of the dried oligomer during cure is about two weight percent. After cure, continued exposure at 400° C., under (Thermogravimetric Analysis) results in a consistent low rate of weight loss of equal to or less than 0.12 wt %/hour was observed, an acceptable value. The curing cycle above is not mandatory, nor critical, and other curing cycles are later provided.

It is also contemplated in accordance with the present invention that copolymers of the oligomers of the present invention will be useful. An example of such a copolymer would be the polymerization product of an acetylene terminated oligomer with triethynyl benzene. Such copolymers are expected to have a higher module due to the presence of polytriethynyl benzene regions and are expected to have higher thermal and dydrolytic stability. The reduction in imide content would also reduce the susceptability of the cured polyimide to absorb water and polar solvents.

The polyisoimide polymerizable oligomers of the present invention which are end-capped with a vinyl or acetylenic end group, (most preferably an acetylenic group) are preferred over the polyamic acids or the preimidized polyimide for the following reasons.

The polyisoimide has a high degree of solubility, comparable to the polyamic acids, and will form concentrated solutions suitable for spin coating a ketonic solvents as well as NMP. The polyimide exhibits the poorest solubility, dissolving only in NMP. Note, however, that the polyisoiide of FIG. 3 is preferred over the polyisoimide of FIG. 4, which is preferred over the polyisoimide of FIG. 5, due to solubility differences resulting from selection of the dianhydride precursors. The makeup of the organic carboxylic polyanhydride precursor to the polyisoimide has a significant effect on the solubility of the polyisoimide, as does the amine functionality and the end-cap group.

The polyisoimides of the present invention soften over a temperature range from about 100° C. to about 160° C., well below the onset of gellation, which occurs over a temperature range from about 160° C. to 190° C., respectively. This capacity, to soften before cross-linking occurs, makes it possible to planarize the polyisoimide upon the surface of the semiconductor device or within the isolation trench configuration prior to reaction to final cured polyimide. Both the polyimide and the polyamic acids soften at temperatures above 190° C.

The isoimide rearranges thermally to yield a cross-linked imide without the evolution of water or alcohol. This is a substantial benefit since water is tenaciously bound in polyimides and is not completely removes until samples are heated at 350° C., or above, for a minimum of 30 minutes. Continuous outgassing of solvent (NMP) and water during cross-linking could result in undesirable porosity and pin-holes.

The molecular weight distribution of the Thermid IP-600 polyisoimide as received (power form) is about 2,000–4,000 (GPC analysis) with no trace of a high molecular weight fraction. Thus, as opposed to the Thermid LR-600 polyamic acid as received, no additional purification and/or fractionation need by conducted.

At present, of the commercially available Thermid non-preimidized polymers available, we believe that only the polyamic acid requires fractionation.

Upon heating (150°–300° C.) the polymerizable oligomers of the present invention undergo three types of reactions: imidization via dehydration of the amic acid or elimination of alcohol from the amic ester functionalities and thermal rearrangement of the isoimide to yield the imide and radically induced addition reactions of the reactive terminal groups, be they vinyl or acetylinic end groups. The terminal end groups can add to other terminal end groups generating cross-links at chain ends or with carbonyl groups contained within the newly-formed polyimide chain. These addition reactions deactivate the requisite reactive functional groups and generate the desired three-dimensional polymer network in the cured polyimide. As earlier noted, conventional linear polyimide resins undergo only imidization upon heating and result in a two-dimensional network.

The polyimides of Takeda et al. will provide a three dimensional network, but are not as soluble as the non-preimidized oligomers, and cannot be planarized at low temperatures as the polyisoimide can be.

As earlier indicated, the oligomers of the present invention can be used to form areas which are to serve as dielectric isolation/passivation regions in electronic components of diverse natures. However, the oligomers of the present invention, due to their excellent characteristics, which will later be discussed, find particular application in filling what have come to be known as deep dielectric isolation trenches. For example, such trenches typically have the following dimensions: 2 $\mu m \times 6$ $\mu m$ to 0.5 $\mu m \times 5.5$ $\mu m$ (width then depth). The present invention is not, of course, limited thereto.

One particular advantage is that the preferred oligomers of the present invention, such as Thermid IP-600 Thermid LR-600 and Thermid AL-600, is that they can be used at high concentrations up to 70 & 80 weight percent or more, based on solution weight (hereinafter same basis unless otherwise indicated) can be used. We believe most typically oligomer concentrations on the order of about 30 weight percent to about 60 weight percent will be conveniently used on a commercial process line scale.

The starting solutions are formed in a simple manner; the oligomer is simply well mixed with the desired solvent to provide an oligomer solution of the desired proportions. Mixing is typically at ambient temperature, but there is no reason why lower or higher temperatures could not be used. Lower temperatures tend to increase solution viscosity and higher temperatures tend to increase solvent volatilization in some cases. Accordingly, we currently see no benefit to using conditions other than at ambient. Mixing can be performed using any conventional mixing device.

The oligomer-containing solution can be applied to the desired portion of the electronic component by any conventional means, for example, spin casting, spraying, meniscus coating, etc.

One major advantage of using the oligomers of the present invention is that they can be thermally or catalytically cured at relatively low temperatures. Typically if a catalyst is used, curing is at a lower temperature than if thermal curing per se is used. If desired, of course, curing can be assisted by the use of irradiation such as electron beams, X-rays, etc.

Following cure, the polymerized oligomers are in the form of a three-dimensional network. As cured, of course, molecular weight cannot be determined. At a catalyst concentrations given above, the polymerizable oligomers are of high molecular weight, so that the end groups comprise on the order of about 1 to about 2 percent by weight of the polymerizable oligomers. For lower molecular weight oligomers, the end groups can comprise up to about 20 percent by weight of the polymerizable oligomers.

After the oligomer-containing solution of the present invention is applied, it can be dried followed by a separate curing step or, more preferably, we use a combined dry/cure cycle. The major benefit to a dry/cure cycle is that, of course, in one processing step we can effect both functions of drying and curing.

In those instances where a separate drying step is used, we normally prefer to use a temperature below the temperature at which any substantial degree of crosslinking occurs. We believe, however, that so long as excessive crosslinking does not occur such that solvent evaporation might harm the desired dielectric isolation, the initiation of curing during solvent drive-off will probably not be harmful. However, we normally prefer to drive off or purge solvent prior to the initation of any substantial degree of curing.

Typically, where a separate drying step is used this will be at a temperature less than about 100° C. for a time of from about ½ to about 2 hours, more generally about 1 hour. For example, where a catalytic cure is used, the temperature of solvent drive-off will be lower than the scission temperature for the catalyst used, for example, for dicumyl peroxide this is 190° C.

We generally, however, prefer to use a combined dry/cure process, whether the curing is catalytic or thermal.

Further, we most prefer to use a stepped dry/cure processing, i.e., where the temperature of the curing polyimide is raised through various steps. By using a stepped dry/cure, at lower temperatures we effect solvent drive-off from the polymerizable oligomer/solvent system (with optional catalyst being present), whereafter at higher temperatures curing is effected. While a stepped dry/cure cycle is not mandatory, this avoids the possibility that solvent evaporation might harm the desired dielectric isolation. Typically solvent drive-off is at a temperature below about 100° C. Times are as earlier given.

Thermal curing is then effected at a temperature of from about 200° C. to about 500° C., more preferably from about 200° C. to about 400° C. While not to be construed as limitative, thermal curing is usually completed in about 4 to 6 hours following the dry cycle of about ½ to about 2 hours, more typically in about 5½ hours.

Thermal curing is typically in an inert atmosphere such as nitrogen, argon etc. Thermal curing can be accomplished, at least in part, in a pressurized chamber in order to promote planarization while the polymerizable oligomers are not highly crosslinked, and thus, are still fluid. Once the polymerization is sufficiently advanced, it is advantageous to use a partial vacuum to assist in removal of residual volatiles.

For catalytic curing, moset conveniently the organic peroxide curing agents are used. These may be freely selected from organic peroxide curing agents as are known in the art, for example, benzoyl peroxide, dicumyl peroxide, etc. The amount of curing agent is not important so long as the desired degree of curing is obtained, and such can readily be determined by one skilled in the art. Typically amounts of catalyst on the order of from about 0.05 to about 10 weight percent based on the weight of the polymerizable oligomer are used, based on the total amount of oligomer present. It is convenient to add the catalyst during the formation of the oligomer solution by blending the same with the oligomer and the desired solvent(s). The atmosphere is the same as for catalytic curing.

As is the case with thermal curing, we also prefer to use a combined dry/cure cycle with catalytic curing. The time period which might be considered devoted to the drying cycle is as above.

Typically, following the dry cycle, catalytic curing is effected in about 1 to about 2 hours or less at a temperature which is sufficient to activate the catalyst, typically for the organic peroxide catalyst (curing agents) this being on the order of about 185° C. to about 190° C., with the dry cycle being at a lower temperature.

If a radiation-induced curing catalytic curing is desired, typically this follows solvent drive off at the above conditions whereafter the desired radiation, e.g., ultraviolet, electron beams, etc., is applied to the oligomer/catalyst using conventional amounts of radiation to initiate the catalyst. Catalysts and amounts are as above described.

Following processing as above, the desired cured polyimide characterized by its three-dimensional network is obtained.

The polymerizable oligomers can be fully cured by heating at 0.5 hours at 200° C., 0.5 hours at 300° C. and 4 hours at 400° C., with all curing above 85° C. being done under nitrogen. An alternative cure cycle involves heating at 85° C. for 30 minutes, 170° C. for 1 hour, 200° C. for 1 hour (300° C. for 1 hour (this step is optional)) and 400° C. for 4½ hours. The time between steps is unimportant and can be rapid. After completion of curing, the cooling rate is unimportant. One skilled in the art will easily appreciate that other curing cycles can be used with success, but we have found the above curing cycles to offer excellent results. A consistently low overall weight loss of about 2 percent during cure occurs with the weight loss being greatest during the earlier part of the cure cycle and trailing off toward the end.

Following curing, if it is desired or necessary to remove the cured polyimide of the present invention so as to planarize the surface thereof, this can be effected using a conventional reactive ion etching in a manner known in the art. Such is described in a manner known in the art. Such is described in detail in "A Survey of Plasma-Etching Processes" by Richard L. Bersin, published in Solid State Technology, May 1976, pages 31–36 and "Reactive Ion Etching in Chlorinated Plasma" by Geraldine C. Schwartz et al., both hereby incorporated by reference. Following the procedure of these publications, the cured polyimide of the present invention can be uniformly etched back with no resultant residue.

Exemplifying the above, the oligomers per the present invention can be readily crosslinked and imidized by heating and that their physical properties can be further improved as a result of morphological changes that occur at higher temperatures, e.g., up to 450° C.

Having thus generally described the oligomers of the present invention, solutions containing the same, means of applying the same and means of curing the same to obtain the desired cured polyimide, we now turn to a detailed discussion of the superior properties of the cured polyimide of the present invention, which are primarily relevant from a device aspect, and to a discussion of the superior properties of the oligomers of the present invention, which are primarily of interest from the processing aspect since in the final device, of course, only the cured polyimide is present.

The cured polyimide contains essentially no voids, bubbles, non-wet areas and exhibits no cracking or crazing in common process solvents.

The cured polyimide exhibits excellent adhesion to various surfaces including metals and inorganic components as are typically used in semiconductor devices, e.g., silicon, alumina and silicon nitride. Adhesion is so good that films of the cured polyimide could not be peeled off from silicon nitride even in the absence of an adhesion promoter. A comparable commercially available cured polyimide (Dupont 5878, trade name) shows this type of adhesion only in the presence of an adhesion promoter. While if desired an adhesion promoter can be used in accordance with the present invention that an adhesion promoter is *not necessary*.

The coefficient of thermal expansion of the cured polyimide is $25.42 \times 10^{-6}$ deg$^{-1}$ which is compatible with the coefficient of thermal expansion of silicon, alumina and silicon nitride and is comparable to that of convention polyimides.

Since the cured polyimide in the trench will remain as a device isolation dielectric, it must be thermally stable and remain substantially unaltered during personalization processing and total chip lifetime. Thermal cycling to temperatures as high as 500° C. can be involved while the material is contained in a bed of inorganic dielectrics. Long-term stability to such thermal cycling conditions is required for chip reliability.

The cured polyimide is thermally stable to 400° C. exhibits negligible outgassing after 10 hours at 400° C., no adhesion loss and no morphological changes. It is believed that the negligible outgassing is due to the presence of interchain crosslinks and although bond scission occurs as a result of heating, fewer volatile groups appear to be generated due to the presence of the crosslinks.

The cured polyimide has excellent electrical properties, e.g., its dielectric constant does not change after exposure to water or thermal cycling and it is resistant to polarization and charge inversion. Due to the higher hydrocarbon content of the cured polyimide and higher degree of crosslinking as compared to conventional polyimides, it is significantly more hydrophobic than conventional polyimides. For example, after exposure to 96% humidity for 1,000 fours the cured polyimide contains less than 1% water and exhibit no change in dielectric constant. The commercially available polyimide Kapton, in comparison, absorbs &2.9% water under comparable conditions and shows a dielectric constant increased 11% over normal.

The increased hydrophobic nature of the cured polyimide also provides the cured polyimide with a minimal tendency to absorb process solvents, thereby reducing its tendency to swell or crack when exposed to, e.g., polar process solvents. This tendency to reduced swelling is a critical factor for trench isolation and is one of the most important variables in forming a successful trench isolation. Further, it is believed that the high degree of cross-linking in the cured polyimide of the present invention interferes with the crack propagation mechanism.

High temperature annealing is generally required to obtain optimum properties with conventional polyimides and this is also the case with the cured polyimides of the present invention. High temperature annealing is in accordance with the conditions used in the prior art for conventional polyimides.

Finally, the assembled three-dimensional network resulting from the radical coupling and addition reactions of the oligomer terminae is significantly more resistant to deformation and cracking than is the two-dimensional conventional polyimide structure, in particular, the cured polyimides of the present invention exhibit a high modulus and tensile strength. More specifically, the cured polyimides of the present invention do not exhibit cracking under thermal stressing and solvent stressing, when used to fill a trench, during post-curing processing.

The oligomers of the present invention also exhibit highly desirable characteristics for use in forming dielectric and/or passivation elements in electronic components, though these properties are primarily from the process viewpoint as opposed to the final device viewpoint.

Because of their low molecular weight and high solubility characteristics, the oligomers of the present invention can be utilized in solutions at a high solids content, e.g. 40-60% by weight, depending on the particular molecular structure and composition of the oligomer involved. Even at such a high solids content, the solutions are sufficiently fluid to trench fill and to planarize with a single application using simple techniques previously discussed. Use of such high solids solutions results in less solvent content and significantly less shrinkage and stress due to volume contraction upon solvent evaporation. In contrast, solutions of high molecular weight polyimides such as RC-5878 (available from du Pont) cannot be used in concentrated solution form due to the prohibitively high viscosity of the resulting solution. Typically usable solutions comprise about 12-15% of such a polyimide and result in voids, delamination and excessive shrinkage when used in trench fill applications.

Because of the low molecular weight of the oligomers, they dissolve in organic alcohols, ketones, ethers, amides, etc., resulting in solutions which readily wet a variety of surfaces, e.g., silicon nitride, ceramic surfaces, silicon dioxide, etc.

Although high molecular weight is desirable in the cured polyimide of the present invention, it is undesirable in the oligomer of the present invention. Increasing the molecular weight increases the viscosity of the oligomer solution at constant mass, and results in solutions with poor levelling and wetting properties. For example, a solution of 45% by weight of the polyamic acid oligomer of the present invention in NMP solvent has a viscosity of 300 cp; and a solution of about 40% by weight of the polyisoimide oligomer in NMP solvent has a viscosity of about 200 cp. By comparison, a 40% solution of a commercially available polyamic acid (Dupont 5878, trade name) has a viscosity of 50-80 kcp.

Having thus generally described the invention, the following working example(s) is/are provided to illustrate currently preferred modes of practicing the same.

EXAMPLE

As earlier indicated, the polymerizable oligomers of the present invention are essentially used as a replacement for dielectric isolation in conventional semiconductor devices and the like. Reference should be made to the earlier patents hereby incorporated by reference.

In this particular instance, a conventional trenched silicon wafer was used, trench dimensions being 2.0 microns (width)×5.5 microns (depth). The polymerizable oligomer selected was Thermid IP-600, the isoimide. It was received in powder form from the vendor and had a molecular weight of from about 2,000 to about 4,000.

It was mixed with NMP at ambient temperature to provide an isoimide solution containing 37% by weight isoimide based on solution weight.

It was then spin coated in a conventional manner on a trenched wafer as above described.

Following application, the polymerizable oligomer solution was subjected to a combined dry/cure cycle at the following conditions in an inert atmosphere (nitrogen) in a conventional heating furnace.

The time of temperature elevation was not important and was merely the time necessary to raise the atmosphere in the dry/cure furnace used from one temperature to the next. The times and temperatures were (starting at ambient): at 85° C. for 10 minutes; at 170° C. for one-half hour; at 200° C. for one-half hour; at 300° C. for one-half hour; at 400° C. for four and one-half hours. No catalyst was used.

Following processing as above, the trenched wafer was removed from the furnace and permitted to cool in the air at ambient conditions.

Conditions of cooling are not important; of course, the cooling rate should not be so fast that any device component would crack or the like, but this will be apparent to one skilled in the art.

Following cooling, the surface of the device was oxygen plasma RIE etched in a standard conventional diode device.

The dielectric isolation obtained exhibited the benefits earlier described.

Fractionated polyamic acid was also used with excellent results as a trench fill material. Solutions in NMP were spun onto trenched structures and step-wise heated to 400° C. to effect full cure. The resulting devices had trenches with no voids or "dewets" and excellent local planarization, i.e., equal to or greater than 95%. Analysis after plasma etch back established that the reactive ion etching was uniform and did not result in any residues.

Trench filling with the isoimide showed excellent local trench planarization with thin (1.3 micron) application. Material flow occurs at 160° C. prior to crosslinking permitting excellent levelling and subsequent plasma etch back produces a planar trench structure. Since we normally use a conventional RIE "etch back" after curing, usually the complete top of the wafer is coated with the polymerizable oligomer solution, e.g., 0.5 & 5 micron dry thickness.

While there has been described what are at present considered to be the preferred embodiments of this invention, it will be obvious to those skilled in the art that various changes and modifications may be made therein without departing from the invention, and it is, therefore, intended to cover all such changes and modifications as fall within the true spirit and scope of the invention.

Having thus generally described the invention, what is claimed is:

1. A method of forming multilevel metallurgy on a substrate having a first conductor pattern on a surface thereof comprising:
   (a) coating said surface and said first conductor pattern with a composition containing a polymerizable oligomer selected from the group consisting of polyamic acids, the corresponding polyamic esters, the corresponding polyisoimides and mixtures thereof, wherein said polymerizable oligomer is vinyl and/or acetylenic end-capped;
   (b) curing said composition to form a three-dimensional imidized layer thereof;
   (c) forming openings in said imidized layer extending to said first conductor pattern; and
   (d) forming a second conductive pattern over said imidized layer, and extending to said first conductor pattern.

2. The method of claim 1 wherein said polymerizable oligomer is a polyisoimide and wherein said polyisoimide comprises one of the class of relatively low-molecular weight oligomers which contain at least one isoimide group along with functional groups that enable the oligomers to be cured by addition polymerization.

3. The method of claim 2 wherein said polyisoimides include the reaction products of a carboxylic acid dianhydride and a functional amine, which reaction product is subsequently dehydrated to form an isoimide-containing oligomer.

4. The method of claim 2 wherein the molecular weight of said polyisoimides ranges between about 2,000 and about 4,000.

5. The method of claim 2 wherein said curing includes at least one 400° C. curing step.

6. The method of claim 5 wherein said cured imidized polyisoimide is subsequently covered with an inorganic dielectric.

7. The method of claim 1 including repeating steps (a) to (d) to the desired multilevel metallurgy desired.

8. The method of claim 7 including an additional step subsequent to said repeating steps, wherein said composition is postcured in situ at temperatures up to about 450° C.

9. The method of claim 1 wherein said substrate comprises an integrated circuit device having elements thereof connected to said first conductor pattern.

10. The method of claim 1 wherein the substrate comprises a multilayer ceramic having conductive circuitry embedded therein and connected to the conductor pattern.

11. The method of claim 1 wherein the weight average molecular weight of said polymerizable oligomers ranges from about 1,000 to about 25,000.

12. The method of claim 11 wherein said molecular weight ranges from about 1,500 to about 8,000.

13. The method of claim 1 wherein said polymerizable oligomer includes at least one component selected from the group consisting of polyamic acids and polyamic esters and wherein said curing is accomplished using a stepped cure cycle.

14. The method of claim 13 wherein said stepped cure cycle is accomplished within a temperature range from about 85° C. to about 400° C.

15. The method of claim 13 wherein said polyamic acids have been fractionated to remove the high molecular weight components.

16. The method of claim 15 wherein the molecular weight of said polyamic acids ranges from about 2,500 to 3,000.

17. The method of claim 1 wherein said curing is accomplished using a catalytic cure.

18. The method of claim 17 wherein said catalytic cure is accomplished using an organic peroxide.

19. The method of claim 18 wherein said curing is accomplished using radiation to initiate said catalyst.

20. The method of claim 1 including the additional step of:
   (e) postcuring said composition in situ at temperatures up to about 450° C.

21. The method of claim 1 wherein at least a portion of said curing is carried out under gaseous pressure in order to promote planarization of said composition.

22. A method for forming multilevel metallurgy on a substrate having a first conductor pattern on a surface thereof comprising:
   (a) coating said surface and said first conductor pattern with a composition comprising a copolymer of triethynyl benzene and a polymerizable oligomer selected from the group consisting of vinyl and/or acetylenic end-capped polyamic acids, the corresponding polyamic esters, the corresponding polyisoimides and mixtures thereof;
   (b) curing said composition to form a three-dimensional imidized layer thereof;
   (c) forming openings in said imidized layer extending to said first conductor pattern; and
   (d) forming a second conductive pattern over said imidized layer, and extending to said first conductor pattern.

23. A method for forming dielectrically isolated island regions in a semiconductor substrate comprising:
   (a) forming in said substrate a recessed trench pattern defining a plurality of isolated island regions;
   (b) filling said trenches with a composition comprising a copolymer of triethynylbenzene and a polymerizable oligomer selected from the group consisting of vinyl and/or acetylenic end-capped polyamic acids, the corresponding polyamic esters, the corresponding polyisoimides and mixtures thereof;
   (c) curing said composition in situ in said trenches to form an imidized three dimensional dielectric polyimide therein.

24. A method for forming dielectrically isolated island regions in a semiconductor substrate comprising:
   (a) forming in said substrate a recessed trench pattern defining a plurality of isolated island regions;
   (b) filling said trenches with a composition comprising a polymerizable oligomer selected from the group consisting of polyamic acids, polyamic esters, polyisoimides and mixtures thereof, wherein said polymerizable oligomer is vinyl and/or acetylenic end capped; and
(c) curing said composition in situ in said trenches to form an imidized three dimensional dielectric polyimide therein, wherein at least a portion of said curing is carried out under gaseous pressure in order to promote planarization of said composition.

25. A method for forming dielectrically isolated island regions in a semiconductor substrate comprising:
  (a) forming in said substrate a recessed trench pattern defining a plurality of isolated island regions;
  (b) filling said trenches with a composition comprising a polymerization oligomer selected from the group consisting of polymeric acids, polyamic esters, polyisoimides and mixtures thereof, wherein said polymerizable oligomer is vinyl and/or acetylenic end capped, and wherein the number average molecular weight of said polymerizable oligomers ranges from about 1,000 to about 25,000; and
  (c) curing said composition in situ in said trenches to form an imidized three dimensional dielectric polyimide therein.

26. A method for forming dielectrically isolated island regions in a semiconductor substrate comprising:
  (a) forming in said substrate a recessed trench pattern defining a plurality of isolated island regions; wherein said recessed trenches range in width from about 0.5 μm to about 2 μm and range in depth from about 5.5 μm to about 6 μm;
  (b) filling said trenches with a composition comprising a polymerizable oligomer selected from the group consisting of polyamic acids, polyamic esters, polyisoimides and mixtures thereof, wherein said polymerizable oligomer is vinyl and/or acetylenic end capped; and
  (c) curing said composition in situ in said trenches to form an imidized three dimensional dielectric polyimide therein.

27. A method for forming dielectrically isolated island regions in a semiconductor substrate comprising:
  (a) forming in said substrate a recessed trench pattern defining a plurality of isolated island regions"
  (b) filling said trenches with a composition comprising a polymerizable oligomer selected from the group consisting of polyamic acids, polyamic esters, polyisoimides and mixtures thereof, wherein said polymerizable oligomer is vinyl and/or acetylenic end capped; and
  (c) curing said composition in situ in said trenches to form an imidized three dimensional dielectric polyimide therein, accomplished using a combined dry/cure cycle wherein said cycle is initiated at about 85° C. and stepped to about 170° C., followed by about 200° C., followed by about 300° C. and a final curing step at about 400° C.

28. The method of claim 27 including an additional post curing step at about 450° C.

29. A method for forming dielectrically isolated island regions in a semiconductor substrate comprising:
  (a) forming in said substrate a recessed trench pattern defining a plurality of isolated island regions;
  (b) filling said trenches with a composition comprising a polymerizable oligomer selected from the group consisting of polyamic acids, polyamic esters, polyisoimides and mixtures thereof, wherein said polymerizable oligomer is vinyl and/or acetylenic end capped; and
  (c) curing said composition in situ in said trenches to form an imidized three dimensional dielectric polyimide therein, wherein a combined dry/cure cycle is utilized and wherein one step in said cycle occurs at a temperature ranging from about 160° C. to 190° C. during which softening and planarization of the dried polyisoimide is obtained prior to crosslinking at subsequent higher temperatures.

30. The method of claim 29 wherein at least a portion of said curing at 160° C. to 190° C. is carried out under gaseous pressure in order to promote planarization of said composition.

31. A method for forming dielectrically isolated island regions in a semiconductor substrate comprising:
  (a) forming in said substrate a recessed trench pattern defining a plurality of isolated island regions;
  (b) filling said trenches with a composition comprising a polyisoimide, wherein said polyisoimide comprises one of the class of relatively low-molecular weight oligomers which contain at least one isoimide group along with functional groups that enable the oligomers to be cured by addition polymerization, and wherein said polyisoimide is vinyl and/or acetylene end-capped; and
  (c) curing said composition in situ in said trenches to form an imidized three dimensional layer, wherein said curing includes at least one 400° C. curing step.

32. The method of claim 31 wherein said cured, imidized, polyisoimide is subsequently covered with an inorganic dielectric.

* * * * *